United States Patent
Hsieh et al.

(10) Patent No.: US 10,969,697 B1
(45) Date of Patent: Apr. 6, 2021

(54) OVERLAY METROLOGY TOOL AND METHODS OF PERFORMING OVERLAY MEASUREMENTS

(71) Applicant: Taiwan Semiconductor Manufacturing Company, Ltd., Hsinchu (TW)

(72) Inventors: Hung-Chih Hsieh, Miaoli County (TW); Chun-Liang Lung, Hsinchu (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 0 days.

(21) Appl. No.: 16/657,172

(22) Filed: Oct. 18, 2019

(51) Int. Cl.
*G03F 7/20* (2006.01)

(52) U.S. Cl.
CPC .................... *G03F 7/70633* (2013.01)

(58) Field of Classification Search
CPC .................................................. G03F 7/70633
See application file for complete search history.

(56) References Cited

U.S. PATENT DOCUMENTS

| | | | |
|---|---|---|---|
| 6,134,011 A * | 10/2000 | Klein | G01J 4/04 250/225 |
| 6,678,043 B1 * | 1/2004 | Vurens | G01N 21/95607 356/237.2 |
| 8,179,536 B2 | 5/2012 | Huang et al. | |
| 8,183,701 B2 | 5/2012 | Shih et al. | |
| 8,531,678 B2 * | 9/2013 | Finarov | G01B 11/24 356/614 |
| 8,716,841 B1 | 5/2014 | Chang et al. | |
| 8,736,084 B2 | 5/2014 | Cheng et al. | |
| 8,796,666 B1 | 8/2014 | Huang et al. | |
| 8,837,810 B2 | 9/2014 | Chen et al. | |
| 9,093,530 B2 | 7/2015 | Huang et al. | |
| 9,134,633 B2 | 9/2015 | Lin et al. | |
| 9,230,867 B2 | 1/2016 | Cheng et al. | |
| 9,304,403 B2 | 4/2016 | Lin et al. | |
| 9,404,743 B2 | 8/2016 | Chiu et al. | |
| 9,548,303 B2 | 1/2017 | Lee et al. | |
| 9,970,860 B2 * | 5/2018 | Murayama | G01N 21/21 |
| 10,249,570 B2 | 4/2019 | Chen et al. | |
| 2004/0004726 A1 * | 1/2004 | Sezginer | G01N 21/956 356/601 |
| 2008/0018897 A1 * | 1/2008 | Littau | G03F 7/70633 356/401 |
| 2008/0198380 A1 * | 8/2008 | Straaijer | G01B 11/0641 356/369 |
| 2016/0161245 A1 * | 6/2016 | Fu | G01B 11/24 250/208.2 |
| 2018/0172514 A1 | 6/2018 | Wu et al. | |

* cited by examiner

*Primary Examiner* — Steven Whitesell Gordon
(74) *Attorney, Agent, or Firm* — Slater Matsil, LLP

(57) ABSTRACT

An overlay metrology tool and diffraction-based overlay measurements are described herein. The tool includes a light source for generating an incident light that illuminates stacked overlay targets formed within material layers of a wafer and a light sensing system for measuring characteristics of a diffracted light beam reflected from the surface of the wafer. During a single illumination of the wafer and without rotating a polarization of the incident light beam, the light sensing system generates three components of the diffracted light beam having one or more polarizations and intensities, according to an overlay recipe associated with the stacked overlay targets.

20 Claims, 9 Drawing Sheets

| Overlay Recipe Condition (polarizations to be used for measurement) | Intensity Tuning | | |
|---|---|---|---|
| | First Transmission Component (Both 0° and 90°) | Second Transmission Component (0° polarization) | Third Transmission Component (90° polarization) |
| Only Both (1) | 100% | 0% | 0% |
| Only Both (2) | >70% | <15% | <15% |
| Only 0 | <10% | ~45% | ~45% |
| Only 90 | <10% | ~45% | ~45% |
| Both and 0 | ~30% | ~30% | ~30% |
| Both and 90 | ~30% | ~30% | ~30% |

Figure 4

OVERLAY METROLOGY TOOL AND METHODS OF PERFORMING OVERLAY MEASUREMENTS

BACKGROUND

Semiconductor integrated circuit (IC) fabrication involves forming multiple material layers with designed patterns on a semiconductor wafer. Each layer has to be aligned with previous layers such that the formed circuit can function properly. Various marks are used for this purpose. For example, overlay targets are used to monitor overlay deviation between the multiple layers as they are being formed on the wafer. In another example, overlay targets are used for alignment between a photomask and the semiconductor wafer. As semiconductor technology continues progressing to circuit layouts having smaller feature sizes, the alignment requirement becomes more stringent, the overlay targets are expected to take less wafer area, and the number and complexity of overlay mark measurements increase. As such, the number of processing steps and the amount of processing time during wafer fabrication continues to increase, resulting in higher manufacturing costs and chip costs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 4 is a table correlating overlay recipe film stack conditions with intensities of transmission components of an overlay recipe used during overlay measurements, in accordance with some embodiments.

DETAILED DESCRIPTION

Figure 1A:
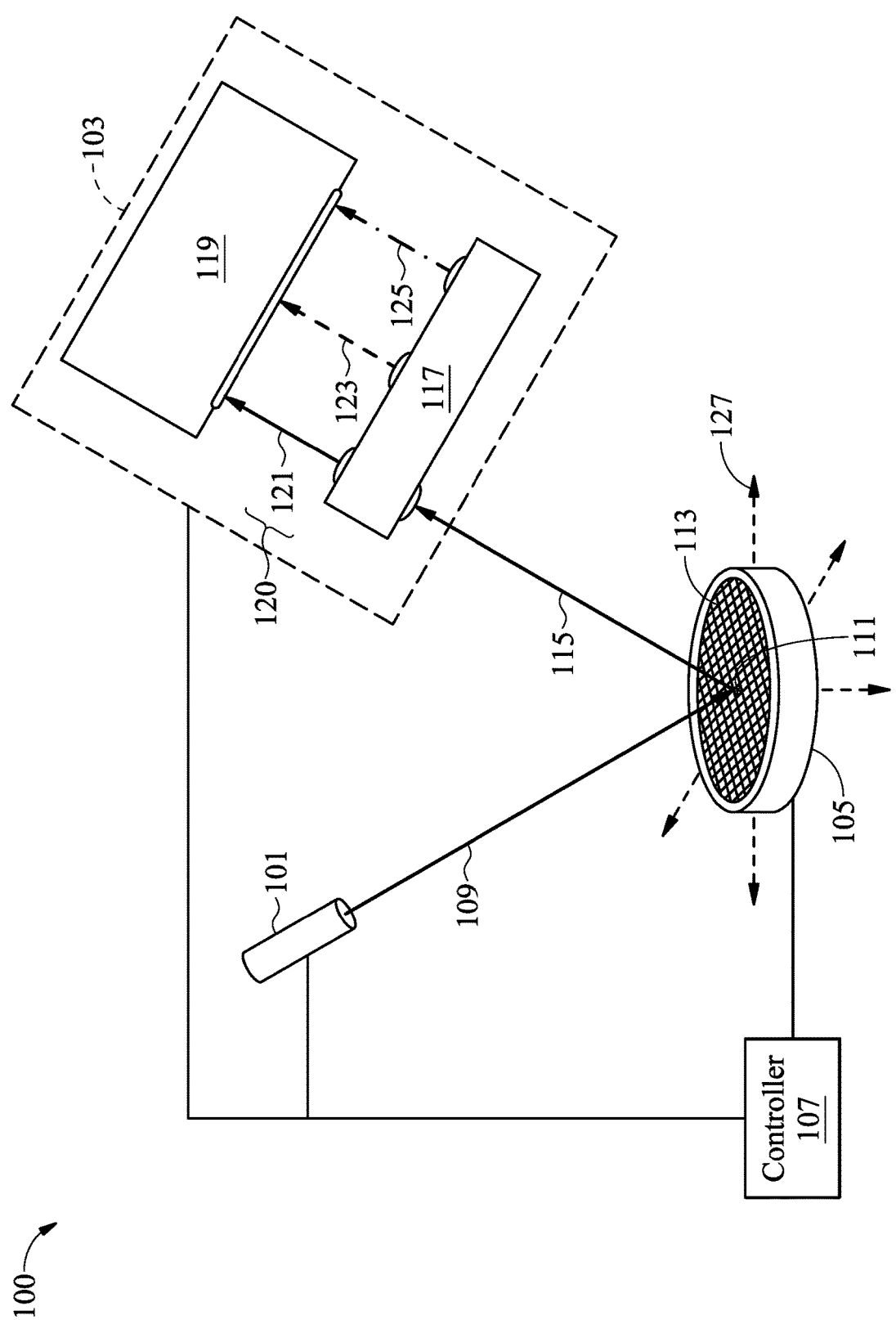
FIG. 1A illustrates an overlay tool comprising a light sensing system for monitoring alignment of target marks within overlay target regions of a wafer, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1B:
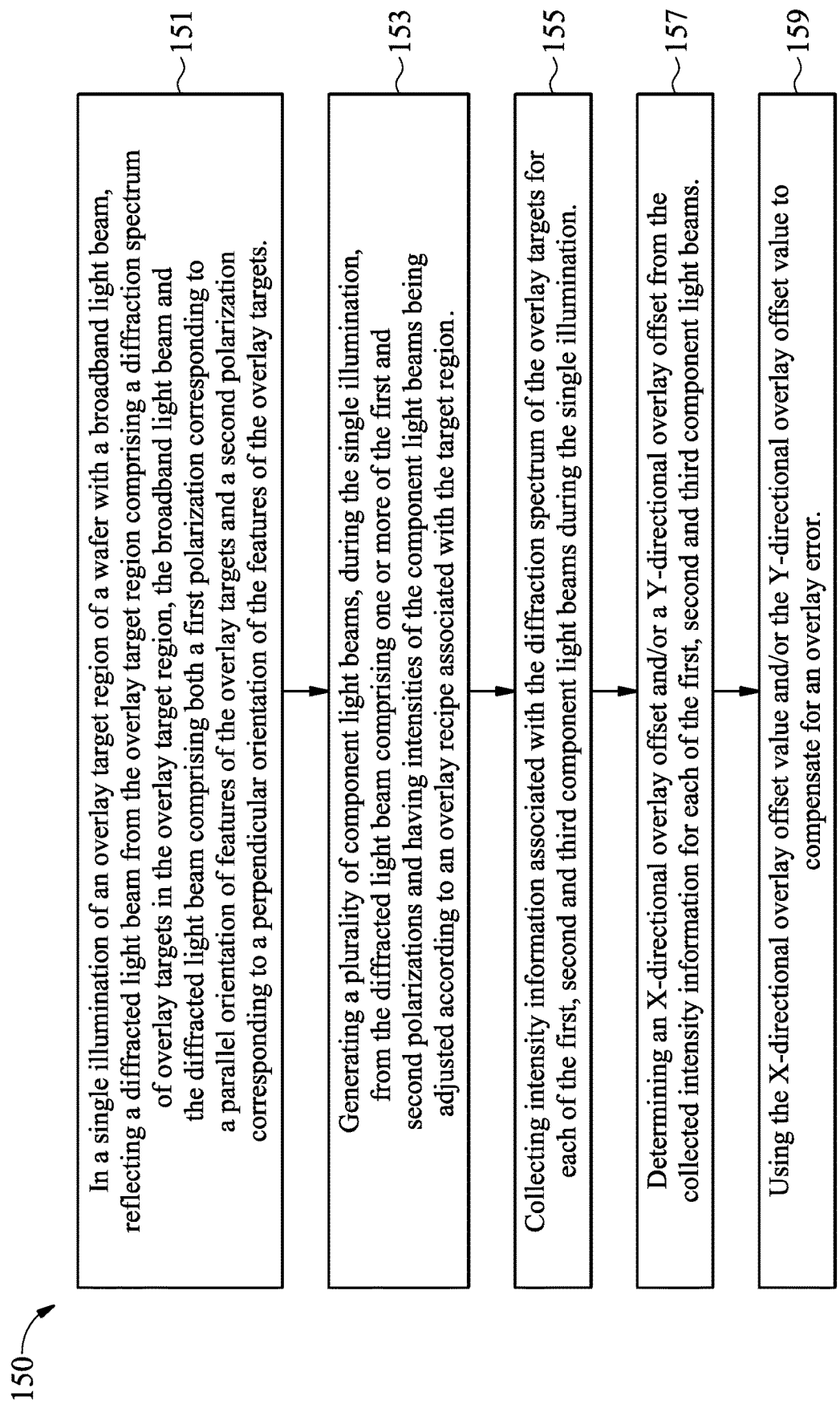
FIG. 1B is a flowchart of an overlay metrology method, which can be implemented by the overlay tool of FIG. 1A, in accordance with some embodiments.

FIGS. 1A and 1B illustrate, in accordance with some embodiments, an overlay tool 100 and an overlay metrology method 150 for monitoring alignment of target marks within overlay target regions of a wafer. In accordance with some embodiments, the overlay tool 100 and the overlay metrology method 150 use overlay targets (e.g., scatterometry-based marks, diffraction-based overlay (DBO) grating targets, overlay marks, and the like) in an optical metrology technique (e.g., scatterometry) to make diffraction pattern measurements of the overlay targets. During a desired wafer fabrication process, these overlay targets are embedded within respective layers of different materials deposited on a wafer and, according to some embodiments, form stacked overlay targets. The stacked overlay targets may be arranged within designated mark regions such as within various locations of cell areas and/or within scribelines of the wafer.

Once the respective layers of the different materials have been deposited, the overlay tool 100 is used during wafer fabrication to perform the diffraction pattern measurements, for example, to monitor for misalignments of patterned masks (e.g., photomask, hard mask, and the like) prior to using the patterned mask. For example, if the overlay tool 100 determines that the mask is properly aligned, the overlay tool 100 indicates that the deposition of the next layer can proceed. However, if the overlay tool 100 determines that the mask is misaligned, the overlay tool 100 indicates that the mask requires rework prior to depositing the next layer.

The overlay tool 100 and overlay metrology method 150 may also be used to determine according to a wafer recipe any deviations in alignments, thicknesses, and/or compositions of respective layers within a wafer during integrated circuit (IC) fabrication of a wafer lot. For example, any deviations in alignment, thicknesses, and/or compositions of respective layers identified for the respective layers associated with the stacked overlay targets can be used to tune an overlay recipe for the desired IC fabrication process. As such, the tuned overlay recipe may be used for any further layers to be deposited on the wafer and/or for any other wafers of the wafer lot being subsequently processed using the wafer recipe for the desired IC fabrication process. As such, the overlay tool 100 and overlay metrology method 150 can be used to minimize and/or eliminate overlay errors during desired IC fabrication processes.

Throughput of the overlay tool 100 and metrology method 150 largely depends on measurement time, which includes time involved with overlay recipe optimization and/or selection. As IC technologies continually progress towards smaller feature sizes (e.g., to 15 nanometers, 12 nanometers, 10 nanometers, and below), process variations and/or material variations profoundly affect quality and/or detectability of diffraction spectrum gathered by the overlay tool 100, such that optimal overlay recipes are constantly changing wafer-to-wafer, lot-to-lot, and/or device-to-device. Overlay recipes are particularly susceptible to material stack changes, such as stack thickness, stack optical properties, and/or stack asymmetry, of overlay targets. In some implementations, where a lot of wafers are processed to form an IC device and an overlay target is fabricated on each wafer, material stack changes that can prevent robust overlay metrology include changes between wafers in thicknesses, optical properties, and/or symmetries of the layers forming the overlay targets. For example, where the overlay targets are associated with a material stack, material changes between wafers in the layers of the material stack will often require modifications to an overlay recipe implemented by the overlay tool 100 for gathering overlay information from the wafers.

Polarization and wavelength detectability changes in response to material stack changes. Stack sensitivity may be a function of a polarization and/or a wavelength of an overlay recipe according to various aspects of the present disclosure. Stack sensitivity (SS) is an index used for overlay measurement detectability, which is a function of material stack characteristics, overlay target design, and/or overlay measurement conditions (for example, measurement polarization and/or measurement wavelength used for illuminating the overlay target). In some implementations, stack sensitivity generally measures changes in an intensity of a diffraction signal (or diffraction spectrum) as a function of changes in material stack characteristics, where the material stack changes arising from process variations and/or material variations from wafer-to-wafer, lot-to-lot, and/or device-to-device. In some implementations, stack sensitivity is proportional to an intensity of a first order diffraction differential of the overlay target of a first wafer $((I^{+1st\ order}-I^{-1st\ order})_{OTW1})$ over an intensity of a first order diffraction differential of the overlay target of a second wafer $((I^{+1st\ order}-I^{-1st\ order})_{OTW2})$. The stack sensitivity (SS) for the material stack of the overlay target may be written as $(I^{+1st\ order}-I^{-1st\ order})_{OTW1}/(I^{+1st\ order}-I^{-1st\ order})_{OTW2}$, where I is an intensity. As such, the stack sensitivity may be a function of different incident radiations having different polarization states, each of which can be implemented in an overlay recipe for gathering overlay information from overlay targets, where material stack changes between wafers resulting from processing variations.

According to some embodiments, an overlay recipe specifies polarizations and corresponding wavelengths of the incident light beam 109 to be used for overlay measurements based on stack sensitivity conditions of a desired overlay target. The overlay recipe specifies the polarizations and corresponding wavelengths to be used for the desired overlay target to ensure detectability of diffraction spectrums from the diffracted light beam 115 having such wavelengths and polarization states for sufficient detectability of overlay errors. In contrast, after material stack changes have occurred, an incident light beam 109 having a certain polarization state and a certain wavelength may no longer provide sufficient diffraction spectrum intensities or may include too much noise based on the stack sensitivity for an overlay target. In such instances, the overlay tool 100 would be unable to detect the diffraction spectrum or would be unable to discern the diffraction spectrum from the noise using the incident light beam 109 having the certain polarization states and/or certain wavelengths. As such, the overlay recipe may be modified to indicate those certain polarization states and/or certain wavelengths of the incident light beam 109 are unsuitable for use in overlay measurements associated with the desired overlay targets exhibiting the material stack changes. Optimization of the overlay recipe is discussed in greater detail below.

With reference to FIG. 1A, according to some embodiments, the overlay tool 100 comprises a light source 101, a light sensing system 103, a wafer stage 105, and a controller 107 for performing the diffraction pattern measurements of the overlay targets in a desired mark region. During the diffraction pattern measurements, the overlay tool 100 utilizes the light source 101 to project an incident light beam 109 onto a desired mark region (e.g., target mark region 111) of a plurality of mark regions of the wafer 113. As such, the diffracted light beam 115 is reflected from the surface of the wafer 113 towards the light sensing system 103 and comprises a diffraction pattern (e.g., a diffraction spectrum, a diffraction profile, a reflectivity profile, or the like) characteristic of the overlay targets in the target mark region 111. The controller 107 may control the positions of one or more of the light source 101, the wafer stage 105 and the light sensing system 103 according to the overlay recipe associated with the target mark region 111 of the wafer 113 in order to ensure that the light source is directed in the target mark region 111 and to ensure that the light sensing system 103 detects the diffracted light beam 115 reflected from the surface of the wafer 113 and, in particular, to ensure that the light sensing system 103 collects information according to the overlay recipe.

With reference to FIG. 1B, a flowchart of the overlay metrology method 150, according to various aspects of the present disclosure is provided. The overlay metrology method 150 can be implemented by the overlay tool 100.

At block 151, the target mark region 111 of the wafer 113 is illuminated with the incident light beam 109 to reflect the diffracted light beam 115 from the target mark region 111 onto the light sensing system 103. In some embodiments, the incident light beam 109 and the diffracted light beam 115 comprise both a first polarization corresponding to a parallel orientation of first features of the overlay targets in the target mark region 111 and a second polarization corresponding to a perpendicular orientation of the first features of the overlay targets. In some embodiments, the overlay targets in the target mark region 111 comprise second features having orientations that are substantially perpendicular to the orientations of the first features. Accordingly, the first polarization of the incident light beam 109 and the diffracted light beam 115 corresponds to a perpendicular orientation of the second features of the overlay targets in the target mark region 111 and the second polarization corresponds to a parallel orientation of the second features of the overlay targets. In a single illumination of the target mark region 111 by the incident light beam 109, the diffracted light beam 115 is reflected from the target mark region 111 comprising a diffraction spectrum of overlay targets in the target mark region 111 and comprising both the first polarization and the second polarization.

Different material compositions, layer thicknesses, and different patterns of overlay targets in different mark regions have distinct properties of reflectivity (e.g., stack sensitivity) with regard to wavelengths and polarities of the incident light beam 109. As such, the diffraction spectrum of the overlay targets in the diffracted light beam 115 reflected off different mark regions may be distinct from one another. Furthermore, the diffraction spectrum of the overlay targets in the diffracted light beam 115 reflected off a desired mark region (e.g., the target mark region 111) may have a stack sensitivity that allows for more accurate readings when using a certain one or more of the polarizations and/or when taken within certain ranges of wavelengths of the diffracted light beam 115. As such, an overlay recipe may be defined and/or optimized to specify the certain one or more polarizations and/or the certain ranges of wavelengths associated with the desired mark region to provide a most accurate reading from the diffraction spectrum.

At block 153, during the single illumination, a plurality of component light beams is generated from the diffracted light beam 115 with intensities of the component light beams being adjusted according to the overlay recipe associated with the target mark region 111. In some embodiments, the light sensing system 103 generates the plurality of component light beams by separating the component light beams from the diffracted light beam 115 and adjusting intensities of the component light beams according to the overlay recipe associated with the target mark region 111. The overlay recipe and the optimizing of the overlay recipe are described in greater detail below.

According to some embodiments, during the single illumination, transmitted components 120 are generated from the diffracted light beam 115. The transmitted components 120 are generated with respective intensities and comprise respective overlay diffraction spectrum having one or more of the first and second polarizations. In some embodiments, the transmitted components 120 comprises a first transmitted component 121 generated with a first intensity and comprises the overlay diffraction spectrum and both the first and second polarizations, a second transmitted component 123 generated with a second intensity and comprises the overlay diffraction spectrum and the first polarization, and a third transmitted component 125 generated with a third intensity and comprises the overlay diffraction spectrum and the second polarization. The first, second, and third intensities may be adjusted according to the overlay recipe associated with the target mark region 111 such that the most accurate readings of the diffraction spectrum of each component light beam may be made during the single illumination.

At block 155, during the single illumination, intensity information of each of the transmitted components 120 is collected as sets of data associated with the diffraction spectrum of the overlay targets. These data sets correlate intensities of the component light beams with the one or more polarizations associated with the component light beams and across certain ranges of wavelengths to define a reflectivity profile of the overlay targets.

At block 157, X-directional overlay offset values and Y-directional overlay offset values are determined for the target marks of the target mark region 111. According to some embodiments, the X-directional overlay offset values are determined by comparing intensities of positive X-directional diffraction patterns to negative X-directional diffraction patterns within the reflectivity profile of the target mark region 111 and Y-directional overlay offset values are determined for the target marks of the target mark region 111 by comparing intensities of positive Y-directional diffraction patterns to negative Y-directional diffraction patterns within the reflectivity profile of the target mark region 111. Furthermore, the reflectivity profile may be used to determine a thickness of one or more of the layers of material in the target mark region 111.

At block 159, the overlay metrology method 150 comprises using the X-directional overlay offset value and/or using the Y-directional overlay offset value to compensate for an overlay error. In some embodiments, the X-directional overlay offset values and/or the Y-directional overlay offset values may be used, for example, to determine whether a photoresist layer should be re-worked before depositing a subsequent layer using the photoresist layer as a mask. According to some embodiments, the X-directional overlay offset values and/or the Y-directional overlay offset values may be used to optimize an overlay recipe for the target mark region 111.

Diffraction pattern measurements can be made from the intensities as a function of wavelength and polarization of the diffracted light beam 115 due to the reflectivity properties of the stacked materials. As such, the controller 107 may direct the light sensing system 103 to collect information about the diffracted light beam 115 including intensities of certain wavelengths having certain polarizations of the diffracted light beam 115. Using the collected information, the controller 107 performs the diffraction pattern measurements and makes the determinations of any misalignments in the patterned mask and/or the determinations of any deviations in alignment of the respective layers associated with the stacked overlay targets embedded within the wafer (e.g., overlay shift). For example, where no overlay shift exists between the overlay marks, the metrology overlay tool will detect no intensity difference in the diffraction spectrum produced by the overlay targets of the stacked materials in the target mark region 111. Any intensity differences in the diffraction spectrum produced by the overlay targets indicate an overlay shift (sometimes referred to as overlay error).

Overlay measurements at certain wavelengths can be sensitive to overlay errors caused by asymmetry-induced errors and/or other process-induced errors. In order to minimize measurement errors during overlay measurements, an overlay recipe can be used to specify particular wavelengths, particular polarizations of the incident light beam 109, particular angles of incidence of the incident light beam 109, and/or other parameters to be used for each mark region of the wafer 113 to ensure accurate readings. The overlay recipe may be initially estimated or modelled during design and then optimized based on the actual overlay measurements of different wafers during wafer fabrication of a wafer lot. To establish a thorough and comprehensive overlay recipe for each mark region, each wavelength at each polarization may be analyzed to determine suitable combinations of wavelengths and polarizations which render accurate measurements. Once the overlay recipe has been established, the overlay recipe may be modified during actual overlay measurements of different wafers over the course of wafer fabrication of a wafer lot, to remove any combinations of wavelengths and polarizations that are deemed no longer suitable for rendering accurate measurements. Furthermore, the overlay recipe may be modified to add any combinations of wavelengths and polarizations that are deemed suitable for rendering accurate measurements.

According to embodiments, the overlay tool 100 generates each polarization of the diffracted light beam 115 for analysis in a single irradiation of the target mark region 111 (e.g., "one-shot" or single illumination). Furthermore, the overlay tool 100, according to some embodiments, generates the incident light beam 109 as a polychromatic light beam comprising a compound polarization including both a parallel polarization (e.g., 0° polarization, 45° polarization, or the like) and a perpendicular polarization (e.g., 90° polarization, −45° polarization, or the like) being orthogonal to the parallel polarization. However, any suitable pair of orthogonal polarizations may be used for the parallel polarization and the perpendicular polarization.

As such, the overlay mark separates the incident light beam 109 into different wavelengths such that the diffracted light beam 115 is reflected from the wafer 113 having the different wavelengths and the compound polarization. According to embodiments, the overlay tool 100 generates the diffracted light beam 115 comprising both polarization and having different wavelengths for analysis in a single irradiation of the target mark region 111 (e.g., "one-shot" or single illumination). As such, the number of processing steps and the amount of time required to perform the overlay measurements are reduced by about 40% or more as compared to the time to perform two irradiations of the target mark region 111 (e.g., "two-shots") comprising only one polarization. Furthermore, the number of processing steps and the amount of time to perform the overlay recipe optimizations are reduced by about 70% or more as compared to the time to perform two irradiations of the target mark region 111 (e.g., "two shots") comprising only one polarization. These reductions in processing steps and time translate to lowering both manufacturing costs and chip costs.

Although the overlay tool 100 is illustrated as directing the incident light beam 109 onto the target mark region 111 of the wafer 113 at an angle of incidence (e.g., between about 0° and about 89°) and the diffracted light beam 115 is reflected off the wafer 113 at an angle of reflection, it is understood that any suitable angle of incidence and any suitable angle of reflection according to the implementations of the overlay tool 100. For example, the overlay tool 100 may use an angle of incidence of between about 0° and about 57°. However, any suitable angle of incidence may be used. According to some embodiments, the overlay tool 100 may comprise imaging components (not shown) to direct and focus the incident light beam 109 onto the target mark region 111 in a direction substantially perpendicular to the surface of wafer 113 and to reflect and focus the diffracted light beam 115 off the wafer 113 in a direction substantially perpendicular to the surface of the wafer 113 and opposite the direction of the incident light beam 109. The various imaging components (not shown) may include beam splitters, polarizers, refractive mirrors, reflective mirrors, imaging lenses, imaging lens systems, depending on design requirements of the overlay tool 100.

Once detected, the light sensing system 103 collects information of the diffraction pattern from the diffracted light beam 115. According to some embodiments, the light sensing system 103 collects intensity information of certain wavelengths and certain polarizations of the diffraction pattern. The light sensing system 103 is directed by the controller 107 to collect all detectable intensities associated with any wavelengths and/or with any polarizations that are detectable by the light sensing system. In other embodiments, the light sensing system 103 is directed by the controller 107 to collect all detectable intensities associated with certain wavelengths and/or with certain polarizations according to an overlay recipe for the wafer 113.

Based on the information collected by the light sensing system 103, diffraction pattern measurements are made by the overlay tool 100 to determine deviations in alignment between the features of the overlay targets in the target mark region 111. According to some embodiments, the controller 107 uses these diffraction pattern measurements and any determined deviations in alignment to determine any misalignment of the stack of materials and, if a misalignment exists, to determine whether or not the deviations in alignment are within an acceptable tolerance range. Furthermore, the controller 107 may determine that certain levels of intensity associated with certain wavelengths and/or with certain polarizations lie outside of acceptable tolerances for obtaining accurate diffraction pattern measurements. As such, the controller 107 uses these determinations to tune the overlay recipe.

The light source 101, according to some embodiments, is a broadband light source (BLS) such as a visual light, infrared (IR) (e.g., far-infrared (FIR)), violet, or ultra-violet (UV) (e.g., extreme ultra-violet (EUV)) source and generates the incident light beam 109 comprising wavelengths between about 12 nm and about 1500 nm. For example, the incident light beam 109 may be generated with a wavelength (e.g., 12 nm) in the EUV range. As a further example, the incident light beam 109 may be generated with a wavelength (e.g., 1500 nm) in the FIR range. Examples of broadband light sources include, but are not limited to, halogen lamps, light emitting diodes, semiconductor lasers, and the like. However, any suitable broadband light source for generating any suitable wavelengths and any suitable intensity may be utilized.

In some embodiments, the light source 101 generates the incident light beam 109 comprising only certain wavelengths having uniform intensities or comprising only certain coherent ranges of wavelengths having certain intensities. According to some embodiments, the light source 101 generates the incident light beam 109 comprising a coherent range of wavelengths between about 400 nm and about 880 nm having uniform intensities and comprises a compound polarization including both a parallel polarization (e.g., 0° polarization) and a perpendicular polarization (e.g., 90° polarization) being orthogonal to the parallel polarization.

The diffracted light beam 115 is polarized according to the incident light beam 109 and, according to embodiments, comprises the compound polarization and the diffraction pattern of the stacked overlay targets in the target mark region 111. A parallel polarization (e.g., 0° polarization) may be used herein as a polarization that is parallel to a first orientation of first features of the stacked overlay targets (e.g., X-direction) and a perpendicular polarization (e.g., 90° polarization) may be used herein as a polarization that is parallel to a second orientation of second features of the stacked overlay targets (e.g., Y-direction), the Y-direction being perpendicular to the X-direction.

The light sensing system 103 measures and collects information about certain characteristics of the diffracted light beam 115 that is used to derive the measurements of the diffraction pattern reflected from the overlay targets in the target mark region 111. According to some embodiments, the light sensing system 103 measures and collects information such as certain intensities of the diffracted light beam 115 at certain wavelengths and/or having certain polarizations. In some embodiments, the incident light beam 109 comprises both a parallel polarization (e.g., 0° polarization, 45° polarization, or the like) and a perpendicular polarization (e.g., 90° polarization, −45° polarization, or the like). The diffracted light beam 115 is reflected from the target mark region 111 with a diffraction pattern of the target marks and both the parallel and perpendicular polarizations of the incident light beam 109. In order to measure and collect the information, the light sensing system 103 separates the diffracted light beam 115 into several components having different desired polarizations of the diffracted light beam 115. In other embodiments, the incident light beam 109 and the diffracted light beam 115 are un-polarized and, in order to measure and collect the information, the light sensing system 103 polarizes and separates the diffracted light beam 115 into components having the desired different polarizations.

FIG. 1A further illustrates, the light sensing system 103 comprising a light processing system 117 and an image sensor 119, according to some embodiments. The light processing system 117 detects the diffracted light beam 115 and generates, in a single irradiation of the target mark region 111 (e.g., "one-shot" or single illumination), the plurality of polarized components from the same reflected light of the diffracted light beam 115. Each of the polarized components of the diffracted light beam 115 comprises a component of the diffraction pattern, respectively. According to some embodiments, the light processing system 117 detects the diffracted light beam 115 and concurrently generates the plurality of transmitted components from the diffracted light beam 115 in "one-shot" of the target mark region 111. For example, during a single illumination of the wafer and without rotating the polarization of the incident light beam 109, the light processing system 117 can generate the plurality of transmitted components from the diffracted light beam 115, wherein the plurality of transmitted components have the different desired polarizations. The plurality of transmitted components of the diffracted light beam 115 may be collectively referred to herein as the transmitted components 120.

In order to construct a comprehensive and accurate model of the overlay targets in the target mark region 111 from the diffracted light beam 115, three component diffraction patterns (e.g., diffraction spectrum) are analyzed. According to some embodiments, the model is constructed from a first component of the diffracted light beam 115 comprising the compound polarization including both the parallel polarization (e.g., 0° polarization) and the perpendicular polarization (e.g., 90° polarization), a second component of the diffracted light beam 115 having the parallel polarization (e.g., 0° polarization), and a third component of the diffracted light beam 115 having the perpendicular polarization (e.g., 90° polarization).

The components of the diffracted light beam 115 can be obtained by performing three separate illuminations of the target mark region 111, each of the illuminations comprising one of the compound polarization, the parallel polarization and the perpendicular polarization. However, by the light processing system 117 detecting the diffracted light beam 115 and generating all of the transmitted components 120 from the diffracted light beam 115 in "one-shot" without rotating the polarization of the incident light beam 109, the first, second and third components of the diffracted light beam 115 are obtained in a single illumination of the of the target mark region 111. As such, the measurements can be made in fewer steps and time of processing is reduced, resulting in time savings and processing costs.

In some embodiments, the light processing system 117 generates from the compound polarization reflected light of the diffracted light beam 115 and during a single illumination of the target mark region 111, a first transmitted component 121 having the compound polarization including both the parallel polarization (e.g., 0° polarization) and the perpendicular polarization (e.g., 90° polarization), a second transmitted component 123 having the parallel polarization (e.g., 0° polarization), and a third transmitted component 125 having the perpendicular polarization (e.g., 90° polarization). The light processing system 117, according to some embodiments, comprises one or more filters for modifying (e.g., increasing or decreasing) an intensity and/or generate a range of wavelengths of one or more of the transmitted components 120 according to an optimal overlay recipe based on properties of the stack of materials of the wafer 113 in the target mark region 111. In such embodiments, the one or more filters may be adapted to modify intensities and/or generate the range of wavelengths of the one or more of the transmitted components 120 to ensure the intensity and wavelengths of the components are sufficient to register with the image sensor 119, according to the overlay recipe. In some embodiments, the intensities of individual wavelengths of the component are modified such that the corresponding wavelengths of the transmitted components 120 have uniform intensities.

The light sensing system 103, according to some embodiments, generates a pupil plane signal and an image plane signal of the polarized components of the diffracted light beam 115. According to embodiments, the light sensing system 103 comprises various optical imaging components (not shown) to focus the pupil plane signal onto a pupil plane of the image sensor 119 and to focus the image plane signal onto an image plane of the image sensor 119.

In some embodiments, the image sensor 119 collects intensity information from each of the transmitted components 120 of the diffracted light beam 115, according to the overlay recipe, to derive the diffraction pattern measurements of the overlay targets in the target mark region 111. According to some embodiments, the image sensor 119 is a sensor array and detects intensities of the diffraction patterns as a function of polarization, as a function of wavelength, and/or as a function of diffraction order. Furthermore, the image sensor 119 obtains intensity information from all of the transmitted components 120 comprising one or more of the parallel and perpendicular polarizations, during the single illumination and without rotating the polarization of the incident light beam 109.

Examples of image sensors include, but are not limited to, sensor arrays, charged coupled device (CCD) sensor array, complementary metal-oxide-semiconductor (CMOS) sensor array, and the like. According to some embodiments, the light transfer in the light sensing system can use fibers.

The wafer stage 105 supports and positions the wafer 113 during operation. The wafer 113 may be secured to the wafer stage 105 by a vacuum (e.g., suction force). However, any suitable mechanical and/or adhesive forces may be used. Furthermore, the wafer stage 105 is adapted to move in one or more linear directions along one or more axes 127 and/or to rotate in either of a clockwise direction or a counterclockwise direction about the one or more axes 127 (e.g., x-axis, y-axis, and/or z-axis). As such, an alignment of the desired target mark region 111 with the light source 101, the angle of incident of the incident light beam 109, and the angle of reflection of the diffracted light beam 115 may be at least partially controlled by the positioning of the wafer stage 105.

The controller 107, according to embodiments, directs the positioning of one or more of the light source 101, the wafer stage 105, and the light sensing system 103 to ensure the desired target region of the wafer 113 is illuminated with the incident light beam 109 and to ensure the diffracted light beam 115 reflected from the desired target mark region 111 is detected by the light sensing system 103. The controller 107 analyzes the intensity information collected by the image sensor 119 to determine the diffraction pattern measurements of the diffracted light beam 115 and to determine whether any overlay offsets are within acceptable tolerance ranges.

According to some embodiments, the X-directional overlay offset value and/or the Y-directional overlay offset value may be used to determine whether a photoresist layer should be reworked before depositing a subsequent layer using the photoresist layer as a mask. For example, the overlay tool 100 may compare the X-directional overlay offset value and/or the Y-directional overlay offset value to an overlay threshold. If it is determined that any deviations in the X-directional and/or Y-directional overlay offsets are within the acceptable tolerance range, the controller 107 indicates that the exposure transfer of the deposited photomask is good and further processing of the wafer may continue. However, if it is determined that any deviations in the X-directional and/or Y-directional overlay offsets are not within the acceptable tolerance range, the controller 107 indicates that the exposure transfer of the deposited photomask needs to be reworked before continuing to subsequent processing steps of the wafer 113.

In some embodiments, the controller 107 may further determine whether or not tuning of the overlay recipe is needed. As such, the X-directional overlay offset value and/or the Y-directional overlay offset value may be used to optimize an overlay recipe. For example, a wavelength of incident radiation is selected for use in subsequent overlay analysis that minimizes (or eliminates) overlay errors caused by asymmetry-induced errors and/or caused by other process-induced errors. Once the overlay recipe has been optimized, the overlay metrology method 150 may continue with performing overlay measurements using the optimized recipe.

Various details associated with each block are described in detail herein. Additional steps can be provided before, during, and after the overlay metrology method 150, and some of the steps described can be moved, replaced, or eliminated for additional embodiments of the overlay metrology method 150.

Although the overlay tool 100 is illustrated in FIG. 1A as a stand-alone system, it is to be understood that the overlay tool 100 may be partly or wholly integrated into the lithographic system, according to some embodiments. For example, in some embodiments, the wafer stage 105 may be incorporated into the lithographic system and the overlay tool 100 may cooperate with the lithography system to control positioning of the wafer stage 105. In other embodiments, the overlay tool 100 and the wafer stage 105 thereof are separate from the lithographic system and, for example, the wafer 113 may be transferred between the lithographic system and the overlay tool 100 during processing of the wafer 113.

According to some embodiments, the overlay tool 100 utilizes overlay targets (e.g., overlay marks, target marks, critical dimension marks, and the like) to sample a number of mark regions throughout the wafer processing. The number of mark regions varies by the semiconductor device design and by the manufacturer's specifications. For example, the overlay tool 100 may be used to sample between about 10 to about 100 mark regions for one die and to sample between about 5 to about 20 dies of one wafer to determine whether the pattern measurements of the deposited photomask are within tolerance. The overlay tool 100 may also be used to sample 1 to 2 wafers of a single lot (e.g., 25 wafers) to ensure consistency of the wafer fabrication processing within the single lot. As such, newly designed devices may go through several thousand metrology processes for one wafer during the start-up period of manufacture.

Figure 2:
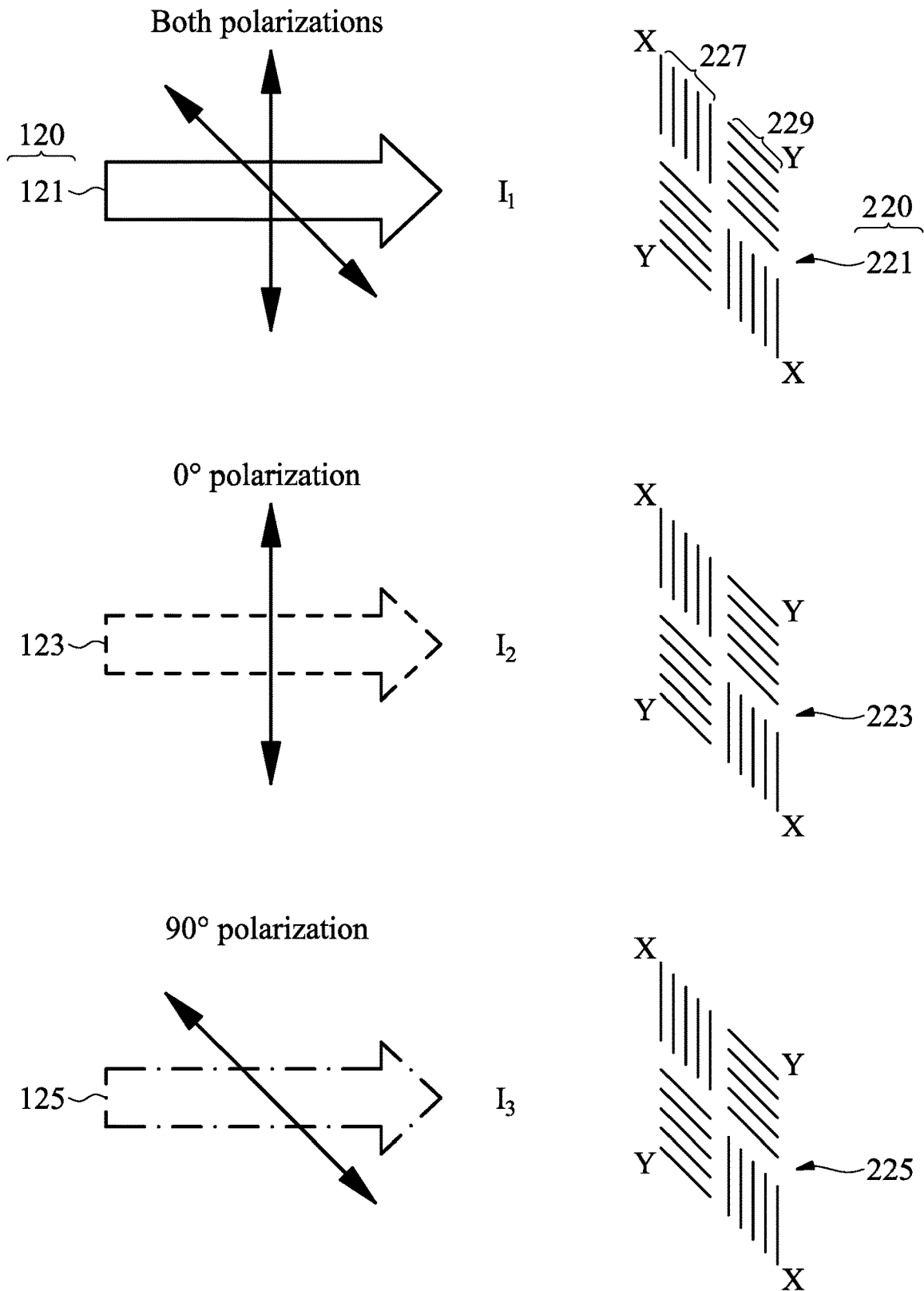
FIG. 2 illustrates polarized components of a light beam reflected from a target mark region of a wafer used by the overlay tool to perform pattern measurements, in accordance with some embodiments.

FIG. 2 illustrates simplified schematic representations of the transmitted components 120 generated by the light processing system 117 from the diffracted light beam 115 reflected from the target mark region 111 of the wafer 113. According to some embodiments, each of the transmitted components 120 comprises one or more wavelengths, one or more polarizations, and associated intensities representative of a respective component of the component diffraction patterns 220 (e.g., diffraction spectrum) of the diffracted light beam 115.

In a particular embodiment, as illustrated in FIG. 2, the first transmitted component 121 comprises a first component diffraction pattern 221. The first component diffraction pattern 221 may be characterized by a plurality of wavelengths (e.g., ranges between about 400 nm and about 880 nm) with multiple polarizations (e.g., both polarizations such as 0° polarization and 90° polarization) and having a first intensity (I1), the first intensity comprising components I1 (0°) and I1 (90°). The second transmitted component 123 comprises a second component diffraction pattern 223. The second component diffraction pattern 223 is characterized by a plurality of wavelengths (e.g., ranges between about 400 nm and about 880 nm), a parallel polarization (e.g., 0° polarization), and a second intensity (I2). The third transmitted component 125 comprises a third component diffraction pattern 225. The third component diffraction pattern 225 is characterized by a plurality of wavelengths (e.g., ranges between about 400 nm and about 880 nm), an orthogonal polarization (e.g., 90° polarization), and a third intensity (I3). As such, the combined spectral and polarization information of the component diffraction patterns 220 gives a complete representation of the overlay marks and materials of the target mark region 111.

According to some embodiments, the overlay targets are grating targets and comprise a plurality of grating patterns such as two sets of X gratings and two sets of Y gratings (e.g., 2×2 grating pattern) comprising features arranged in orthogonal patterns. As such, the diffracted light beam 115, reflected off the X gratings and Y gratings, comprises a first set of orthogonal diffracted beam patterns 227 and a second set of orthogonal diffracted beam patterns 229. However, the overlay targets may have any suitable number of grating patterns (e.g., 2×3, 2×4, or the like) and the diffracted light beam 115 may comprise any corresponding suitable number of sets of orthogonal diffracted beam patterns and any suitable number and/or ranges of wavelengths.

According to an embodiment, the overlay targets comprise a 2×2 grating pattern comprising a first series of X-features of first critical dimensions that are uniformly spaced apart by a first pitch and are arranged in a first orientation (e.g., X-direction) and a first series of Y-features of the first critical dimensions that are uniformly spaced apart by the first pitch and are arranged in a second orientation (e.g., Y-direction), the second orientation (e.g., 90°) being perpendicular to the first orientation (e.g., 0°). As such, a 0° polarization direction of the transmitted components 120 of the diffracted light beam 115 is a polarization direction that is parallel with respect to the X-direction of the first set of orthogonal diffracted beam patterns 227 and is perpendicular with respect to the Y-direction of the first set of orthogonal diffracted beam patterns 227. A 90° polarization direction of the transmitted components 120 of the diffracted light beam 115 is a polarization direction that is parallel with respect to the Y-direction of the first set of orthogonal diffracted beam patterns 227 and is perpendicular with respect to the X-direction of the first set of orthogonal diffracted beam patterns 227.

Furthermore, according to some embodiments, the 2×2 grating pattern includes a second set of grating patterns comprising a second series of X-features of second critical dimensions and a second series of Y-features of second critical dimensions. The second series of X-features are uniformly spaced apart by a second pitch different from the first pitch and are arranged in a third orientation (e.g., X-direction) and the second series of Y-features are uniformly spaced apart by the second pitch and arranged in a fourth orientation (e.g., Y-direction), the fourth orientation (e.g., 90°) being orthogonal to the third orientation (e.g., 0°). As such, a 0° polarization direction of the transmitted components 120 of the diffracted light beam 115 is a polarization direction that is parallel with respect to the Y-direction of the second set of orthogonal diffracted beam patterns 229 and is perpendicular with respect to the X-direction of the second set of orthogonal diffracted beam patterns 229. A 90° polarization direction of the transmitted components 120 of the diffracted light beam 115 is a polarization direction that is parallel with respect to the Y-direction of the second set of orthogonal diffracted beam patterns 229 and is perpendicular with respect to the X-direction of the second set of orthogonal diffracted beam patterns 229. However, any suitable orthogonal orientations (e.g., −45° and 45°) of the series of X-features and the series of Y-features may be used.

Furthermore, the image sensor 119 collects information by measuring the intensities of the diffracted light beam 115 in multiple spectral bands and in multiple polarization angles in order to capture comprehensive optical characteristics of the overlay marks in the target mark region 111. According to some embodiments, the image sensor 119 collects information regarding characteristics of each of the components of the component diffraction patterns 220 (e.g., diffraction spectrum) of the transmitted components 120. An overlay shift is proportional to a difference between intensities of positive and negative first order diffractions in the component diffraction patterns 220. As such, the intensity information collected by the image sensor 119 can be used to determine deviations in alignment and/or overlay offsets. In some embodiments, X-directional overlay offsets are calculated from the intensities of the first set of orthogonal diffracted beam patterns 227 for each of the component diffraction patterns 220 and Y-directional overlay offsets are calculated from the intensities of the second set of orthogonal diffracted beam patterns 229 for each of the component diffraction patterns 220.

Figure 3A:
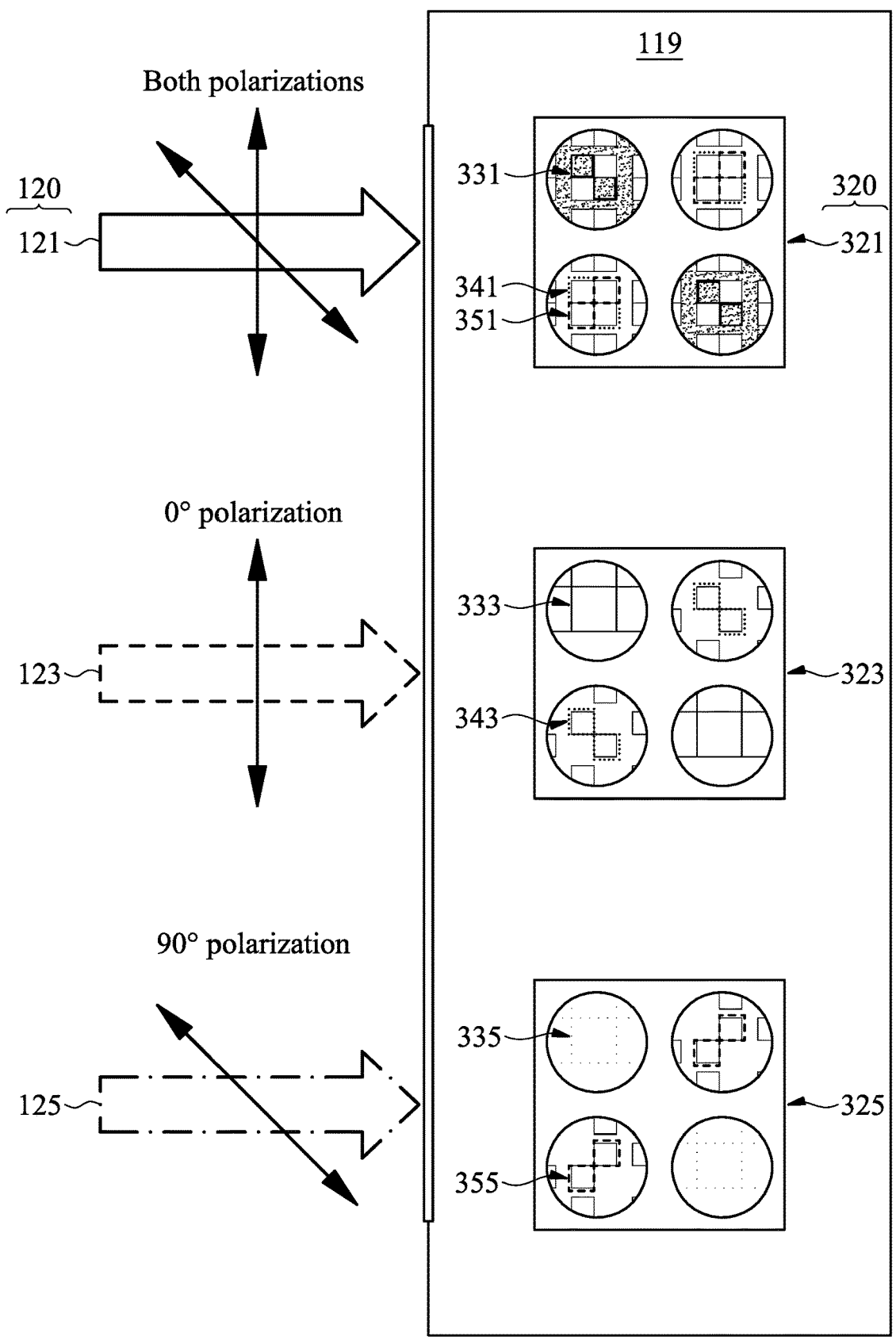
FIG. 3A illustrates an image sensor of the overlay tool used for collecting diffraction-based information from the polarized components of FIG. 2, in accordance with some embodiments.

FIG. 3A illustrates, according to some embodiments, a plurality of overlay images 320 formed from the intensity information of the component diffraction patterns 220 associated with the target mark region 111 and carried by the transmitted components 120. The light sensing system 103 uses the collected intensity information correlated with the polarizations of the transmitted components 120 and the component diffraction patterns 220 to derive pattern measurements and to calculate disparity in alignment of the overlay targets in the target mark region 111. The plurality of overlay images 320 may be simulated using the pattern measurements derived from the collected intensity information. In some embodiments, the plurality of overlay images 320 may be formed to represent certain critical dimensions and certain parameters of the wafer fabrication process to indicate which features are misaligned and what part of the wafer fabrication process is causing the misalignment.

According to some embodiments, the plurality of overlay images 320 (e.g., diffraction images) comprises a compound overlay image profile 321, an X-direction component overlay image profile 323, and a Y-direction component overlay image profile 325. Although illustrated as an optical image, it is understood that the overlay images 320 may be formed as one or more of graphs, tables, or the like.

The compound overlay image profile 321, in some embodiments, is a diffraction image formed from the intensity information collected from the first component diffraction pattern 221 associated with the target mark region 111 and associated with the first transmitted component 121 comprising both polarizations (e.g., 0° polarization and 90° polarization). The compound overlay image profile 321, according to some embodiments, comprises a first compound overlay map 331 (e.g., 0 order diffraction image), a second compound overlay map 341, and a third compound overlay map 351. The compound overlay image profile 321, according to some embodiments, comprises a first compound overlay map 331 (e.g., an image of the zero-order diffraction signals in both the X-direction and Y-direction), a second compound overlay map 341 (e.g., an image comprising X-direction intensity factors), and a third compound overlay map 351 (e.g., an image comprising Y-direction intensity factors). The intensity factors of the second compound overlay map 341 relate to features of the target region 111 aligned in the X-direction and may be used to calculate an overlay misalignment in the X-direction. The intensity factors of the third compound overlay map 351 relate to features of the target region 111 aligned in the Y-direction and may be used to calculate an overlay misalignment in the Y-direction.

The X-direction component overlay image profile 323 is formed from the intensity information collected from the second component diffraction pattern 223 of the second transmitted component 123 comprising the parallel polarization (e.g., 0° polarization). The X-direction component overlay image profile 323, in some embodiments, is formed from the intensity information collected from the second component diffraction pattern 223 associated with the target mark region 111 and associated with the second transmitted component 123 comprising the parallel polarization (e.g., 0° polarization). The X-direction component overlay image profile 323, according to some embodiments, comprises a first X-direction overlay map 333 (e.g., an image of the zero-order diffraction signal in the X-direction) and a second X-direction overlay map 343 (e.g., an image comprising X-direction intensity factors). The intensity factors of the second X-direction overlay map 343 relate to features of the target region 111 aligned in the X-direction and may be used to calculate an overlay misalignment in the X-direction.

The Y-direction component overlay image profile 325 is formed from the intensity information collected from the third component diffraction pattern 225 of the third transmitted component 125 comprising the perpendicular polarization (e.g., 90° polarization). The Y-direction component overlay image profile 325 is formed from the intensity information collected from the third component diffraction pattern 225 of the third transmitted component 125 comprising the parallel polarization (e.g., 0° polarization). The Y-direction component overlay image profile 325, in some embodiments, is formed from the intensity information collected from the third component diffraction pattern 225 associated with the target mark region 111 and associated with the third transmitted component 125 comprising the perpendicular polarization (e.g., 90° polarization). The Y-direction component overlay image profile 325, according to some embodiments, comprises a first Y-direction overlay map 335 (e.g., an image of the zero-order diffraction signal in the Y-direction) and a second Y-direction overlay map 355 (e.g., an image comprising Y-direction intensity factors). The intensity factors of the second Y-direction overlay map 355 relate to features of the target region 111 aligned in the Y-direction and may be used to calculate an overlay misalignment in the Y-direction.

In some implementations, the overlay tool 100 generates overlay measurements, such as overlays (sometimes referred to as overlay errors), by calculating a difference between the measured overlay shifts and known overlay shifts, such as target biases in an X-direction and a y-direction. In some implementations, based on the overlay measurements, the overlay tool 100 analyzes various metrics for identifying overlay measurements with minimal (or no) asymmetry-induced overlay errors and/or other process induced overlay errors, and then identifies a wavelength(s) for optimizing overlay measurements during IC fabrication. In some implementations, overlay tool 100 generates overlay information on a per wafer basis, such that overlay metrology module 260 generates an optimal overlay recipe (in particular, selecting an optimal wavelength(s) for performing overlay measurements) on a per wafer basis. In some implementations, the optimal overlay recipe defines a polarization state of the selected optimal wavelength(s). In some implementations, overlay tool 100 generates an optimal overlay recipe after a defined number of processes wafers or on a per lot basis. During wafer fabrication, overlay tool 100 can then perform overlay measurements according to the optimal overlay recipe. For example, in some implementations, the overlay tool 100 analyzes intensity information associated with only wavelengths selected by the overlay tool 100 for optimizing overlay measurements. In some implementations, the overlay tool 100 is configured to illuminate the overlay targets with incident radiation having only wavelengths selected by overlay metrology module 260.

Furthermore, any discrepancies in alignment between adjacent material layers (e.g., overlay shift, misalignment-induced overlay error, asymmetry-induced overlay errors, and/or other process induced errors) can also be checked to determine if the discrepancies in alignment are within an acceptable tolerance and if the overlay recipe film stack conditions associated with the target mark region are still valid. For instance, the overlay tool 100 may analyze the overlay recipe can be tuned for each mark region to minimize sensitivity of the overlay measurements (e.g., stack sensitivity) to the alignment discrepancies, the characteristics of the material layers and the stacked overlay targets in the target mark region.

The overlay recipe may be based on simulated models and/or developed in early stages of design for a new device. The overlay recipe specifies optimal overlay recipe film stack conditions (e.g., wavelengths, polarizations, intensities, and the like of the transmitted components 120) to be used during overlay measurements for each mark region so that the information collected and used to ensure the overlay measurement is the most accurate overlay measurement possible. However, these overlay recipe film stack conditions may become invalid due to differences between the simulated stack sensitivities and the measured stack sensitivities.

The overlay tool 100 may be used for constructing (tuning) a material stack for facilitating accurate overlay measurements and/or accurate material stack predictions (simulations). For example, in some embodiments, a thickness of various material layers can be adjusted when tuning the material stack. Once the material stack has been tuned, comparisons of the simulated stack sensitivity to the actual measured stack sensitivity can be used to bring the simulated stack sensitivity observed at each wavelength condition closer to the measured stack sensitivity. Such modifications can be considered when simulating stack sensitivity for subsequently processed wafers, such that a more accurate material stack model can be built for simulating and estimating overlay information.

Furthermore, these overlay recipe film stack conditions may become invalid due to deviations in the wafer fabrication process. For example, in order for the image sensor 119 to register and sense an intensity of any of the transmitted components 120, the image sensor 119 must receive the transmitted components 120 with a minimum acceptable intensity level. As such, during wafer fabrication, any deviations in the material layers (e.g., thicknesses, compositions, and the like) and any deformation of the overlay targets (e.g., due to overlay-shift errors, asymmetry-induced errors, and the like) may affect the accuracy of the measurements taken using certain optimal overlay recipe film stack conditions. For example, a specific optimal overlay measurement condition of the overlay recipe for the target mark region 111 may have been considered to be valid during a previous overlay measurement is determined during a subsequent overlay measurement to no longer be valid (e.g., below the minimum acceptable intensity level), that specific optimal overlay measurement condition associated with the target mark region may be indicated as no longer valid in the overly recipe and/or may be removed from the overlay recipe. These overlay recipe film stack conditions include, but are not limited to, parameters such as wavelength, polarization, intensity of the light used to perform the overlay measurement, and stack sensitivity. However, any suitable overlay recipe film stack conditions may be used. In order to ensure the best possible measurement is made for a desired mark region, the overlay tool 100 uses one or more optimal overlay recipe film stack conditions for the desired mark region as specified by the overlay recipe.

For example, in implementations where a stack sensitivity of greater than a desired threshold is needed for optimizing overlay measurements, the overlay tool 100 can quickly assess that certain wavelengths will not work for optimizing the overlay measurements. As such, the overlay tool 100 can then evaluate stack sensitivity and/or other criteria corresponding with the other wavelengths and polarizations to select a best wavelength and polarization for performing overlay measurements. In some implementations where higher stack sensitivity leads to improved overlay measurement detectability, the overlay tool 100 selects the first wavelength and corresponding best polarizations for an optimized overlay recipe. In some implementations where too high of a stack sensitivity introduces instability that can skew an overlay measurement, the overlay tool 100 selects another wavelength and corresponding best polarization for an optimized overlay recipe. Because the overlay tool 100 acquires intensity information for the various wavelengths and the three components in a single shot (in other words, a single illumination of overlay target 10), the overlay tool 100 can quickly generate overlay information and select optimal wavelengths for incident radiation IR based on the overlay information.

Figure 3B:
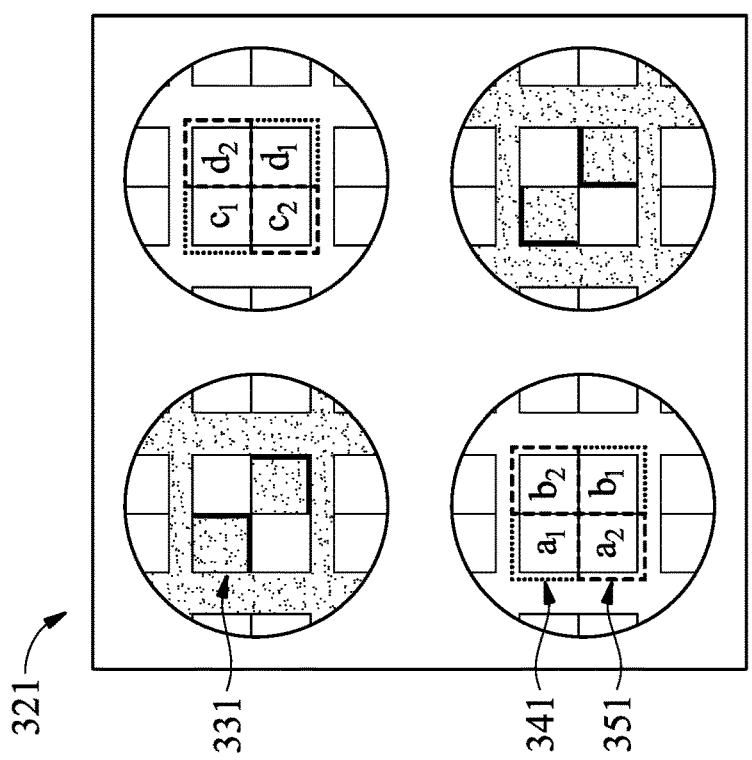
FIG. 3B illustrates an overlay image profile of the collected diffraction-based information, in accordance with some embodiments.
Figure 3C:
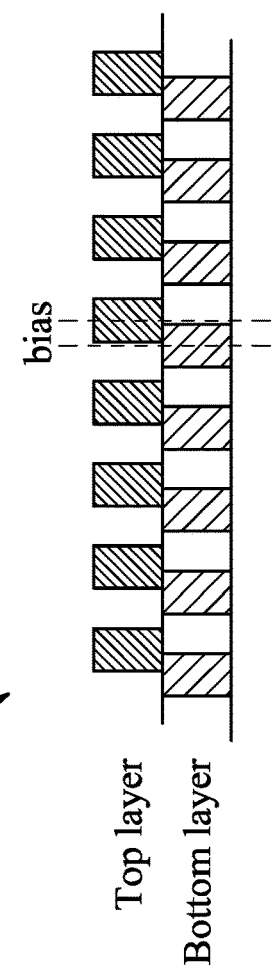
FIG. 3C illustrates a given shift between layers of a target mark region, in accordance with some embodiments.

FIGS. 3B and 3C relate to features of the overlay image profile 321 and features of the target mark region 111 used in calculating the overlay misalignments for the target mark region 111. In particular, FIG. 3B illustrates a magnified view of the compound overlay image profile 321 of FIG. 3A, in accordance with some embodiments. The X-direction intensity factors (a, b, c, d) of the second compound overlay map 341 relate to X-direction features of the target mark region 111. FIG. 3C illustrates a given shift (e.g., bias) between a top layer of the target mark region and a bottom layer of the target mark region 111. The given shift may be a bias, for example, in the X-direction (e.g., bias X) or in the Y-direction (e.g., biasY). As such, a first overlay misalignment (OVL1) in the X-direction may be calculated from the X-direction intensity factors (a1, b1, c1, d1) using a first equation (EQ.1), where biasX is the given shift, for example, in the X-direction. The Y-direction intensity factors (a2, b2, c2, d2) of the third compound overlay map 351 relate to Y-direction features of the target mark region 111. As such, a second overlay misalignment (OVL2) in the Y-direction may be calculated from the Y-direction intensity factors (a2, b2, c2, d2) using a second equation (EQ.2), where biasY is the given shift, for example in the Y-direction.

$$OVL1 = [(a_1-c_1)+(b_1-d_1)]/[(a_1-c_1)-(b_1-d_1)] \times biasX \qquad EQ.\ 1.$$

$$OVL2 = [(a_2-c_2)+(b_2-d_2)]/[(a_2-c_2)-(b_2-d_2)] \times biasY \qquad EQ.\ 2.$$

Furthermore, the first overlay misalignment (OVL1) in the X-direction may be calculated from the X-direction intensity factors of the second X-direction overlay map 343 of the X-direction component overlay image profile 323 of FIG. 3A. In addition, the second overlay misalignment (OVL2) in the Y-direction may be calculated from the Y-direction intensity factors of the second Y-direction overlay map 355 of the Y-direction component overlay image profile 325 of FIG. 3A. Accordingly, overlay misalignments in both an X-direction and in a Y-direction of the target mark region 111 can be calculated using the intensity factors of one or more of the overlay images 320 obtained from the intensities of the transmitted components 120 collected by the image sensor 119.

FIG. 4 is a table correlating overlay recipe film stack conditions used with the overlay recipe to select optimal polarities and intensities of the first transmitted component 121, the second transmitted component 123, and the third transmitted component 125. During wafer fabrication, the overlay tool 100 performs overlay measurements according to the optimal overlay recipe associated with the target mark region 111 of the wafer 113. In some implementations, the overlay tool 100 analyzes intensity information associated with only those wavelengths and only those polarizations selected from the optimal overlay recipe. In other implementations, the overlay tool 100 analyzes intensity information associated with all wavelengths and all polarizations collected by the image sensor 119. The optimal overlay recipe, according to embodiments, specifies the optimal wavelengths, optimal polarizations, intensities of the transmitted components 120, and the like to be collected by the image sensor 119 and to be used in perform the measurements.

According to some embodiments, the overlay tool 100 may be directed by the overlay recipe to perform the overlay measurement for the target mark region 111 according to overlay recipe conditions that trigger and dictate whether certain polarizations (e.g., "Only Both (1)," "Only Both (2)", "Only 0°," "Only 90°," "Both and 0°," and "Both and 90°") and/or whether certain intensity levels (e.g., 100%, >70%, ~45%, ~30%, <15%, <10%, or 0%) of the transmitted components 120 are to be used for the target mark region 111. For example, the first overlay recipe condition (e.g., "Only Both (1)") may dictate that both polarizations (e.g., 0° and 90°) are to be utilized for the overlay measurement of the target mark region 111 and may further specify that the overlay measurement is to be performed, for example, using the first transmitted component 121 at 100% intensity of the diffracted light beam 115 while using 0% intensities for the second transmitted component 123 and for the third transmitted component 125. The second overlay recipe condition (e.g., "Only Both (2)") may dictate, for example, that both polarizations (e.g., 0° and 90°) are to be utilized for the overlay measurement and is to be performed using the first transmitted component 121 at or above 70% intensity of the diffracted light beam 115 while using less than about 15% intensities for the second transmitted component 123 and for the third transmitted component 125. The third overlay recipe condition (e.g., "Only 0") may dictate, for example, that the parallel polarizations (e.g., 0°) is to be utilized for the overlay measurement and is to be performed using the first transmitted component 121 at or below 10% intensity of the diffracted light beam 115 while using about 45% intensities for the second transmitted component 123 and for the third transmitted component 125. The fourth overlay recipe condition (e.g., "Only 90") may dictate, for example, that the perpendicular polarization (e.g., 90°) is to be utilized for the overlay measurement and is to be performed using the first transmitted component 121 at or below 10% intensity of the diffracted light beam 115 while using about 45% intensities for the second transmitted component 123 and for the third transmitted component 125. The fifth overlay recipe condition (e.g., "Both and 0") may dictate, for example, that both polarizations (e.g., "Both 0° and 90°") and the parallel polarization (e.g., 0°) are to be utilized for the overlay measurement and is to be performed using about 30% intensity of the diffracted light beam 115 for each of the transmitted components 120. The sixth overlay recipe condition (e.g., "Both and 90") may dictate, for example, that both polarizations (e.g., "Both 0° and 90°") and the perpendicular polarization (e.g., 90°) are to be utilized for the overlay measurement and is to be performed using about 30% intensity of the diffracted light beam 115 for each of the transmitted components 120.

Overlay recipe film stack conditions may include, but are not limited to, wavelengths, polarizations, intensities of the transmitted components 120 to be used during measurements, stack sensitivities of the mark regions, and the like. The overlay tool 100 uses the component diffraction patterns 220 to derive pattern measurements and to calculate disparity in alignment of the overlay targets in the target mark region 111 being measured. However, any other parameters that can be adjusted to tune the overlay measurements performed by the overlay tool 100 may be used. As such, based on the overlay recipe film stack conditions for the desired mark region, a diffraction pattern of the stacked overlay targets in the desired mark region illuminated by the incident light beam 109 is generated in the diffracted light beam 115 reflected from the wafer. As such, accurate overlay measurements can be made. From the accurate overlay measurements, misalignments in the overlay targets and/or patterned mask are used by the overlay tool 100 to tune the overlay recipe for the respective mark region. In some implementations, an optimal overlay recipe will minimize asymmetry-induced overlay errors and/or other process induced overlay errors while ensuring an intensity of the diffraction spectrum is sufficiently detectable for analysis.

Figure 5:
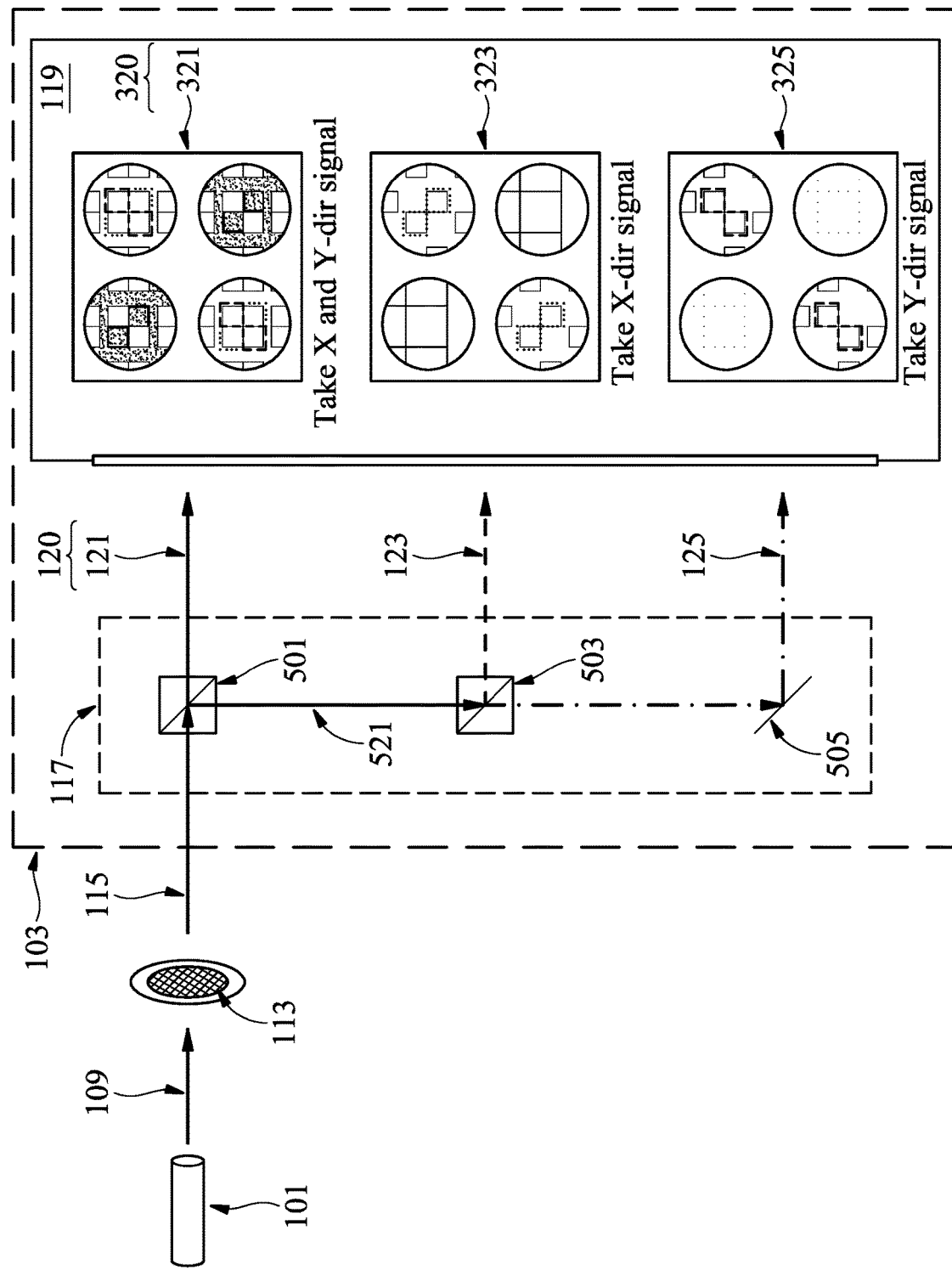
FIGS. 5-7 illustrate the overlay tool of FIG. 1A comprising the light sensing system, in accordance with some embodiments.

FIG. 5 illustrates, according to some embodiments, the overlay tool 100 with a more detailed view of the light processing system 117 and the image sensor 119 of the light sensing system 103 of FIG. 1A. FIG. 5 further illustrates simplified views of the light source 101, the incident light beam 109, the wafer 113, and the diffracted light beam 115 of the overlay tool 100 of FIG. 1A for ease of discussion.

The light processing system 117 generates the transmitted components 120 from the diffracted light beam 115 reflected from the target mark region 111 of the wafer 113. In some embodiments, the light processing system 117 comprises a beam splitter (BS) 501, a polarization beam splitter (PBS) 503, and a mirror 505.

The beam splitter (BS) 501 divides the diffracted light beam 115 into the first transmitted component 121 having a first intensity and a first reflected component 521 having a second intensity, wherein the sum of the first intensity and the second intensity equals the intensity of the diffracted light beam 115. In some embodiments, the first transmitted component 121 and the first reflected component 521 have both the parallel and perpendicular polarizations (e.g., 0° and 90° polarizations) and have the same intensities. The first transmitted component 121 is transmitted through the beam splitter (BS) 501 and focused onto the image sensor 119. The first reflected component 521 is reflected about 90° through the beam splitter (BS) 501 and is directed to the polarization beam splitter (PBS) 503. The beam splitter (BS) 501 may be tuned, for example, according to the optimal overlay recipe based on a stack sensitivity of the target mark region 111 of the wafer 113. In some embodiments, the beam splitter (BS) 501 is tuned, for example, via the controller 107 to transmit the first transmitted component 121 with a first intensity and to reflect the first reflected component 521 with a second intensity equal to the first intensity. In other embodiments, the beam splitter (BS) 501 is tuned to transmit the first transmitted component 121 with the first intensity being about 100% and to reflect the first reflected component 521 of the diffracted light beam 115 with a second intensity being about 0%. In still other embodiments, the beam splitter (BS) 501 is tuned to transmit the first transmitted component 121 with the first intensity being greater than about 70% and to reflect the first reflected component 521 with the second intensity being less than about 30%. In yet other embodiments, the beam splitter (BS) 501 is tuned to transmit the first transmitted component 121 with the first intensity being less than about 10% and to reflect the first reflected component 521 with the second intensity being greater than about 90%. In other embodiments, the beam splitter (BS) 501 is tuned to transmit the first transmitted component 121 with the first intensity being about 30% and to reflect the first reflected component 521 with the second intensity being about 70%.

The polarization beam splitter (PBS) 503 divides the first reflected component 521 into the second transmitted component 123 and the third transmitted component 125 having the same intensity having each having one of two orthogonal polarization directions (e.g., 0°, 90°, 45° and −45°, and the like). For example, the second transmitted component 123 having only the parallel polarization (e.g., 0° polarization) and the third transmitted component 125 having only the perpendicular polarization (e.g., 90° polarization). However, the X-direction signal (e.g., 0° polarization) and the Y-direction signal (e.g., 90° polarization) are interchangeable. As such, the second transmitted component 123 may have only the perpendicular polarization (e.g., 90° polarization) and the third transmitted component 125 may have only the parallel polarization (e.g., 0° polarization). The second transmitted component 123 is reflected by the polarization beam splitter (PBS) 503 about 90° and is focused onto the image sensor 119 and the third transmitted component 125 is transmitted onto the mirror 505 and is reflected by the mirror 505 about 90° and is focused onto the image sensor 119. According to embodiments, the polarization beam splitter (PBS) 503 is a single device. In other embodiments, the polarization beam splitter (PBS) 503 comprises a combination of waveplates (not shown) or retarders (not shown).

In some embodiments, the polarization beam splitter (PBS) 503 is tuned, for example, via the controller 107 to reflect a first percentage of intensity of the diffracted light beam 115 and transmit a second percentage of intensity of the diffracted light beam 115, according to the optimal overlay recipe based on a stack sensitivity of the stack of materials in the target mark region 111 of the wafer 113. According to some embodiments, the beam splitter (BS) 501 may be tuned, for example, via the controller 107 to reflect 50% percentage of intensity of the first reflected component 521 to the second transmitted component 123 and to reflect 50% percentage of intensity of the first reflected component 521 to the third transmitted component 125. However, any suitable percentages may be used.

According to some embodiments, during wafer fabrication, when the optimal overlay recipe specifies that "only both (1)" condition should be used to perform the measurements, the beam splitter (BS) 501 is tuned to transmit about 100% of the intensity of the diffracted light beam 115 to the first transmitted component 121 and transmit about 0% of the intensity to the second transmitted component 123 and to the third transmitted component 125. In the event that the optimal overlay recipe specifies that "only both (2)" condition should be used to perform the measurements, the beam splitter (BS) 501 is tuned to transmit at least about 70% of the intensity of the diffracted light beam 115 to the first transmitted component 121 and transmit at most about 15% of the intensity to the second transmitted component 123 and transmit at most about 15% of the intensity to the third transmitted component 125. In the event that the optimal overlay recipe specifies that "only 0" condition or "only 90" condition should be used to perform the measurements, the beam splitter (BS) 501 is tuned to transmit less than about 10% of the intensity of the diffracted light beam 115 to the first transmitted component 121 and transmit about 45% of the intensity to the second transmitted component 123 and transmit about 45% of the intensity to the third transmitted component 125. In the event that the optimal overlay recipe specifies that "Both and 0" condition or "Both and 90" condition should be used to perform the measurements, the beam splitter (BS) 501 is tuned to transmit less than about 30% of the intensity of the diffracted light beam 115 to the first transmitted component 121 and transmit about 30% of the intensity to the second transmitted component 123 and transmit about 30% of the intensity to the third transmitted component 125.

Figure 6:
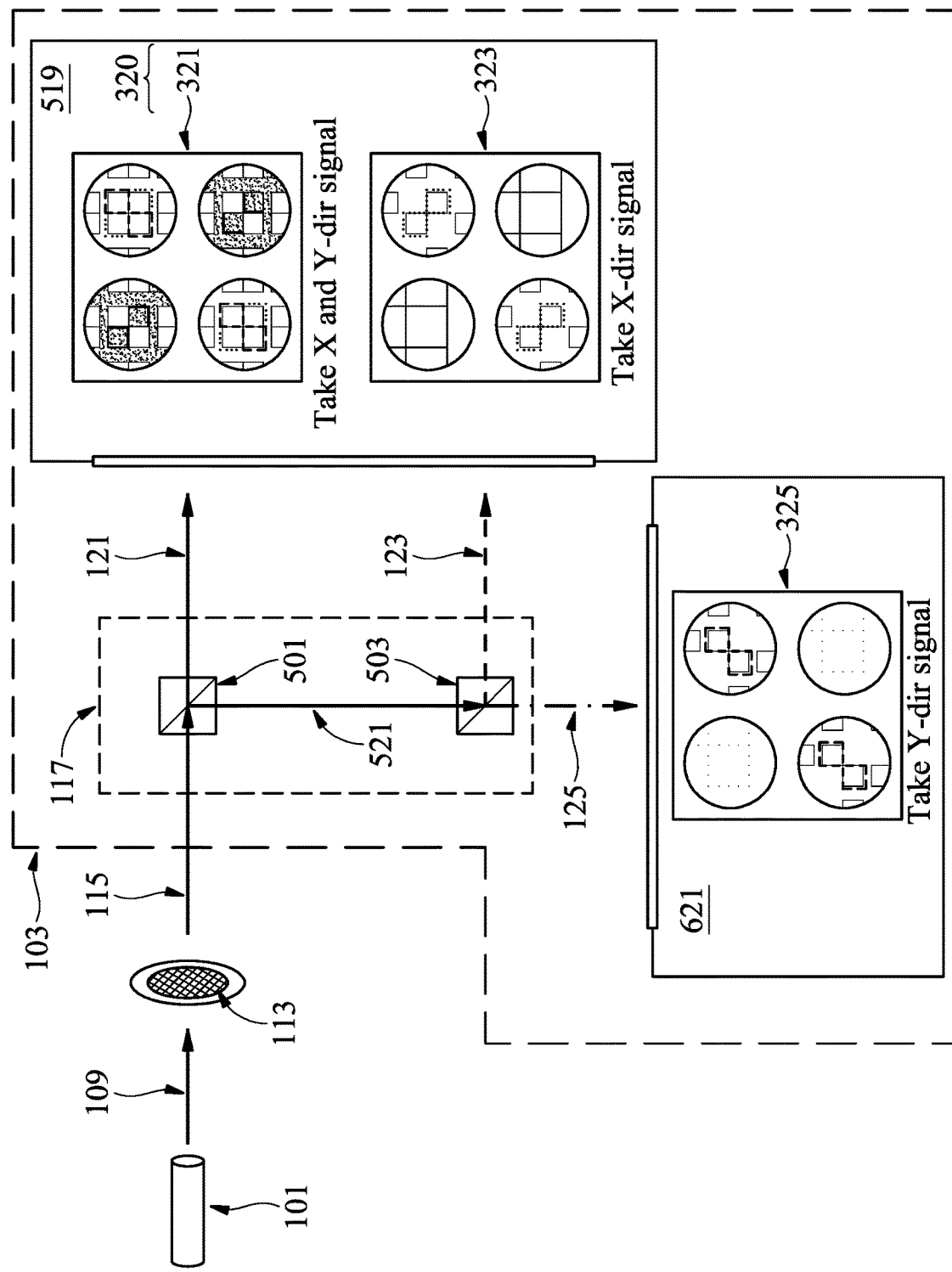

FIG. 6 illustrates, according to some other embodiments, the overlay tool 100 with a more detailed view of the light processing system 117 and the image sensor 119 of the light sensing system 103 of FIG. 1A. FIG. 6 is similar to FIG. 5 except where the image sensor 119 of FIG. 5 is replaced with a first image sensor 519 for receiving the first transmitted component 121 and second transmitted component 123 and the mirror 505 of FIG. 5 is replaced with a second image sensor 621 for receiving the third transmitted component 125. As such, the compound overlay image profile 321 and X-direction component overlay image profile 323 are formed from the pattern measurements of the first image sensor 519 and the Y-direction component overlay image profile 325 is formed from the pattern measurements of the second image sensor 621.

Figure 7:
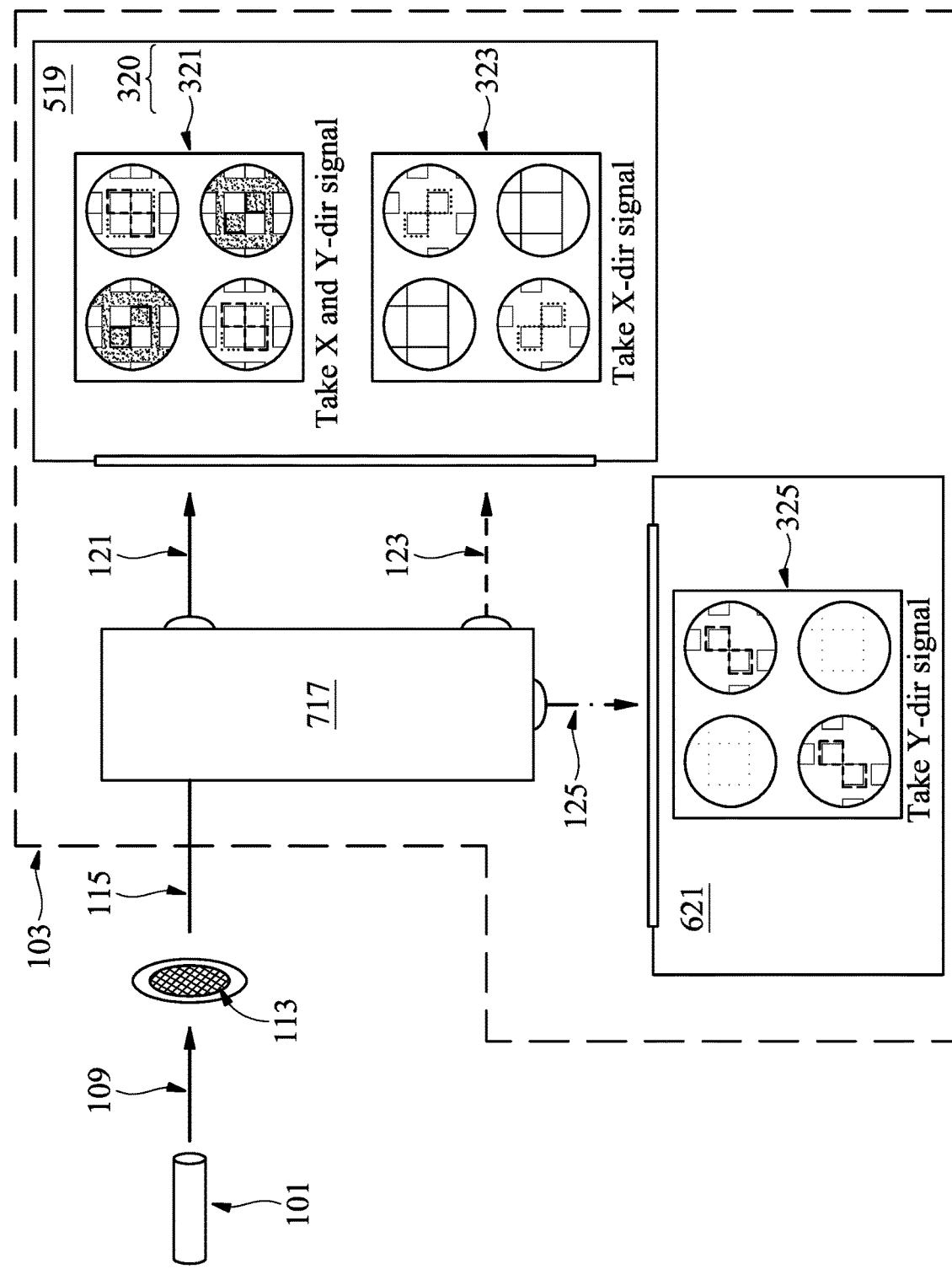

FIG. 7 illustrates, according to still some other embodiments, the overlay tool 100. FIG. 7 is similar to FIG. 6 except where the beam splitter (BS) 501 and the polarization beam splitter (PBS) 503 of FIG. 5 are combined together in a single device such as a light splitting device 717 for receiving the diffracted light beam 115 and generating the first transmitted component 121, the second transmitted component 123 and the third transmitted component 125. According to some embodiments, the light splitting device 717 is adapted to perform the functions of the beam splitter (BS) 501 and the polarization beam splitter (PBS) 503 to split the diffracted light beam 115 into the first transmitted component 121, the second transmitted component 123, and the third transmitted component 125, the first transmitted component 121 and the second transmitted component 123 being transmitted to the first image sensor 519 and the third transmitted component 125 being transmitted to the second image sensor 621. According to some embodiments, the light splitting device 717 comprises a combined beam splitter.

According to embodiments, the overlay tool 100 generates both polarizations of the diffracted light beam 115 for analysis in a single irradiation of the target mark region 111 (e.g., "one-shot" or single illumination). Furthermore, the overlay tool 100, according to some embodiments, generates the incident light beam 109 as a polychromatic light beam having a compound polarization including both a parallel polarization (e.g., 0° polarization) and a perpendicular polarization (e.g., 90° polarization) being orthogonal to the parallel polarization. As such, the overlay mark separates the incident light beam 109 into different wavelengths such that the diffracted light beam 115 is reflected from the wafer 113 having the different wavelengths and the compound polarization. According to embodiments, the overlay tool 100 generates the diffracted light beam 115 comprising both polarization and having the different wavelengths for analysis in a single irradiation of the target mark region 111 (e.g., "one-shot" or single illumination). As such, the number of processing steps and the amount of time required to perform the overlay measurements are reduced by about 40% as compared to the time to perform two irradiations of the target mark region 111 (e.g., "two-shots") comprising only one of the polarizations. Furthermore, the number of processing steps and the amount of time to perform the overlay recipe optimizations are reduced by about 70% as compared to the time to perform two irradiations of the target mark region 111 (e.g., "two shots") comprising only one of the polarizations. These reductions in processing steps and time translate to lowering both manufacturing costs and chip costs.

According to an embodiment, a method includes reflecting a light beam off a wafer; generating a first transmitted component comprising two orthogonal polarizations from the light beam; generating a second transmitted component comprising a first polarization of the two orthogonal polarizations from the light beam, the first and second transmitted components being generated during a single illumination of the wafer without rotating a polarization of the light beam; collecting intensity information from at least one of the first and second transmitted components; and determining an overlay error between material layers of the wafer from the intensity information. In an embodiment, the method includes beam splitting the light beam reflected from the wafer into the first transmitted component having a first intensity and a first reflected component comprising the two orthogonal polarizations. In an embodiment, the method includes polarizing the first reflected component into the second transmitted component having a second intensity. In an embodiment, the method includes tuning first and second intensities according to an overlay recipe associated with an overlay mark region of the wafer. In an embodiment, the method includes tuning the first intensity to 100% of an intensity of the light beam and tuning the second intensity to 0% of the intensity of the light beam based on the overlay recipe. In an embodiment, the method includes tuning the first intensity to at least 70% of an intensity of the light beam and tuning the second intensity to at most 15% of the intensity of the light beam based on the overlay recipe. In an embodiment, during the single illumination of the wafer without rotating a polarization of the light beam, further includes beam splitting the first reflected component into the second transmitted component and a second reflected component; polarizing the second reflected component into a third transmitted component having a second polarization of the two orthogonal polarizations from the light beam and a third intensity; and tuning the third intensity according to the overlay recipe, wherein the collecting the intensity information further comprises collecting information of an intensity from at least one of the first, second, and third transmitted components.

According to another embodiment, a method includes receiving a diffracted light beam reflected from a stack of overlay marks in a target mark region of a wafer, the diffracted light beam comprising a pair of orthogonal polarizations; splitting the diffracted light beam to form a first component comprising both polarizations of the pair of orthogonal polarizations and to form a first reflected component; polarizing the first reflected component to form a second component comprising a first polarization of the pair of orthogonal polarizations, the first and second components being formed during a single illumination of the wafer without rotating a polarization of the diffracted light beam; measuring at least one intensity of the first and second components; and determining from the measuring an overlay error between the stack of overlay marks. In an embodiment, the method includes tuning intensities of at least one of the first and second components according to an overlay recipe associated with the target mark region and dividing the intensity of the diffracted light beam into a first portion and a first remaining portion, adjusting the intensity of the first component to the first portion and adjusting the intensity of the first reflected component to the first remaining portion; and dividing the intensity of the first reflected component evenly between a second portion and a second remaining portion and adjusting the intensity of the second component to the second portion. In an embodiment, the method includes transmitting 100% of the intensity of the diffracted light beam into the first portion, transmitting 0% of the diffracted light beam into the first remaining portion and transmitting 0% of the intensity of the diffracted light beam into the second portion and transmitting 0% of the intensity of the diffracted light beam into the second remaining portion. In an embodiment, the method includes dividing at least 70% of the intensity of the diffracted light beam into the first portion and dividing the remaining intensity of the diffracted light beam into the first remaining portion, dividing at most 15% of the intensity of the diffracted light beam into the second portion and dividing at most 15% of the intensity of the diffracted light beam into the second remaining portion. In an embodiment, the method includes splitting the first reflected component into a first split component and a second split component, polarizing the first split component to form the second component having the first polarization, and polarizing the second split component to form a third component during the single illumination of the wafer without rotating the polarization of the diffracted light beam, the third component having a second polarization of the pair of orthogonal polarizations, adjusting an intensity of the third component to the second remaining portion, and measuring an intensity of at least one of the first, second, and third components. In an embodiment, the method includes dividing at most 10% of the intensity of the diffracted light beam into the first portion and dividing the remaining intensity of the diffracted light beam into the first remaining portion, dividing at least 45% of the intensity of the diffracted light beam into the second portion and dividing at least 45% of the intensity of the diffracted light beam into the second remaining portion based on the overlay recipe; and adjusting the intensity of the third component to the second remaining portion. In an embodiment, the method includes dividing at least 30% of the intensity of the diffracted light beam into the first portion and dividing the remaining intensity of the diffracted light beam into the first remaining portion, dividing at least 30% of the intensity of the diffracted light beam into the second portion and dividing at least 30% of the intensity of the diffracted light beam into the second remaining portion, and adjusting the intensity of the third component to the second remaining portion based on the overlay recipe.

According to a further embodiment, a method includes generating an incident light beam comprising a parallel polarization and a perpendicular polarization; illuminating a stack of grating targets with the incident light beam; reflecting a diffraction pattern beam off the stack of grating targets comprising both of the parallel polarization and the perpendicular polarization; splitting the diffraction pattern beam into a first component beam and a first reflected beam, during a single illumination of the stack of grating targets, the first component beam comprising a first intensity and both parallel and perpendicular polarizations; polarizing the first reflected beam into a second component beam during the single illumination of the stack of grating targets without rotating a polarization of the incident light beam, the second component beam comprising a second intensity and the parallel polarization; measuring an intensity of at least one of the first and second component beams; and determining an overlay error based on the measuring. In an embodiment, the method includes adjusting a first intensity of the first component beam based on an overlay recipe associated with the stack of grating targets and focusing the first component beam on an image sensor. In an embodiment, the method includes directing the first reflected beam to a polarizing beam splitter device; splitting and polarizing the first reflected beam into the second component beam and a third component beam having a third intensity and the perpendicular polarization; and adjusting intensities of the second component beam and the third component beam based on the overlay recipe to a same intensity. In an embodiment, the method includes focusing the second component beam on the image sensor and reflecting the third component beam off of a mirror and focusing the third component beam on the image sensor. In an embodiment, the method includes focusing the second component beam on the image sensor and focusing the third component beam on another image sensor. In an embodiment, the method further includes adjusting the first intensity of the first component beam to at most 10% of an intensity of the diffraction pattern beam; and adjusting the intensities of the second and third component beams to be the same intensity, the same intensity being at least 45% of the intensity of the diffraction pattern beam.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
reflecting a light beam off a wafer;
generating a first transmitted component comprising two orthogonal polarizations from the light beam;
generating a second transmitted component comprising a first polarization of the two orthogonal polarizations from the light beam, the first and second transmitted components being generated during a single illumination of the wafer without rotating a polarization of the light beam;
collecting intensity information from the first and second transmitted components, the first transmitted component still comprising the two orthogonal polarizations; and
determining an overlay error between material layers of the wafer from the intensity information.

2. The method of claim 1, wherein the generating the first transmitted component comprises beam splitting the light beam reflected from the wafer into the first transmitted component having a first intensity and a first reflected component comprising the two orthogonal polarizations.

3. The method of claim 2, wherein the generating the second transmitted component comprises polarizing the first reflected component into the second transmitted component having a second intensity.

4. The method of claim 3, wherein generating the first and second transmitted components comprises tuning first and second intensities according to an overlay recipe associated with an overlay mark region of the wafer.

5. The method of claim 4, wherein the tuning first and second intensities further comprises tuning the first intensity to 100% of an intensity of the light beam and tuning the second intensity to 0% of the intensity of the light beam based on the overlay recipe.

6. The method of claim 4, wherein the tuning first and second intensities further comprises tuning the first intensity to at least 70% of an intensity of the light beam and tuning the second intensity to at most 15% of the intensity of the light beam based on the overlay recipe.

7. The method of claim 4, during the single illumination of the wafer without rotating a polarization of the light beam, further comprising:
beam splitting the first reflected component into the second transmitted component and a second reflected component;
polarizing the second reflected component into a third transmitted component having a second polarization of the two orthogonal polarizations from the light beam and a third intensity; and
tuning the third intensity according to the overlay recipe, wherein the collecting the intensity information further comprises collecting information of an intensity from at least two of the first, second, and third transmitted components.

8. A method, comprising:
receiving a diffracted light beam reflected from a stack of overlay marks in a target mark region of a wafer, the diffracted light beam comprising a pair of orthogonal polarizations;
splitting the diffracted light beam to form a first component comprising both polarizations of the pair of orthogonal polarizations and to form a first reflected component;
polarizing the first reflected component to form a second component comprising a first polarization of the pair of orthogonal polarizations, the first and second components being formed during a single illumination of the wafer without rotating a polarization of the diffracted light beam;
tuning intensities of at least one of the first and second components, the tuning comprising:
dividing an intensity of the diffracted light beam into a first portion and a first remaining portion, adjusting an intensity of the of the first component to the first Portion and adjusting an intensity of the first reflected component to the first remaining portion; and
dividing the intensity of the first reflected component evenly between a second portion and a second remaining portion and adjusting an intensity of the second component to the second portion;
measuring at least one intensity of the first and second components; and
determining from the measuring an overlay error between the stack of overlay marks.

9. The method of claim 8, wherein the tuning the intensities of at least one of the first and second components comprises tuning the intensities according to an overlay recipe associated with the target mark region.

10. The method of claim 9, wherein:
the dividing the intensity of the diffracted light beam further comprises transmitting 100% of the intensity of the diffracted light beam into the first portion and transmitting 0% of the diffracted light beam into the first remaining portion; and
the dividing the intensity of the first reflected component evenly further comprises transmitting 0% of the intensity of the diffracted light beam into the second portion and transmitting 0% of the intensity of the diffracted light beam into the second remaining portion.

11. The method of claim 9, further comprising:
dividing at least 70% of the intensity of the diffracted light beam into the first portion and dividing the remaining intensity of the diffracted light beam into the first remaining portion; and
dividing at most 15% of the intensity of the diffracted light beam into the second portion and dividing at most 15% of the intensity of the diffracted light beam into the second remaining portion.

12. The method of claim 9 further comprises:
splitting the first reflected component into a first split component and a second split component, wherein the polarizing the first reflected component further comprises:
polarizing the first split component to form the second component having the first polarization; and
polarizing the second split component to form a third component during the single illumination of the wafer without rotating the polarization of the diffracted light beam, the third component having a second polarization of the pair of orthogonal polarizations,
wherein the tuning intensities of at least one of the first and second components further comprises adjusting an intensity of the third component to the second remaining portion; and
wherein the measuring the at least one intensity further comprises measuring an intensity of at least one of the first, second, and third components.

13. The method of claim 12, further comprising:
dividing at most 10% of the intensity of the diffracted light beam into the first portion and dividing the remaining intensity of the diffracted light beam into the first remaining portion; and
dividing at least 45% of the intensity of the diffracted light beam into the second portion and dividing at least 45% of the intensity of the diffracted light beam into the second remaining portion based on the overlay recipe; and
adjusting the intensity of the third component to the second remaining portion.

14. The method of claim 12 further comprises:
dividing at least 30% of the intensity of the diffracted light beam into the first portion and dividing the remaining intensity of the diffracted light beam into the first remaining portion; and
dividing at least 30% of the intensity of the diffracted light beam into the second portion and dividing at least 30% of the intensity of the diffracted light beam into the second remaining portion; and
adjusting the intensity of the third component to the second remaining portion based on the overlay recipe.

15. A method, comprising:
generating an incident light beam comprising a parallel polarization and a perpendicular polarization;
illuminating a stack of grating targets with the incident light beam;
reflecting a diffraction pattern beam off the stack of grating targets comprising both of the parallel polarization and the perpendicular polarization;
splitting the diffraction pattern beam into a first component beam and a first reflected beam, the splitting comprising adjusting a first intensity of the first component beam based on an overlay recipe associated with the stack of grating targets and focusing the first component beam on an image sensor, during a single illumination of the stack of grating targets, the first component beam comprising a first intensity and both parallel and perpendicular polarizations;
splitting and polarizing the first reflected beam into a second component beam and a third component beam during the single illumination of the stack of grating targets without rotating a polarization of the incident light beam, the second component beam comprising a second intensity and the parallel polarization, the third component beam comprising a third intensity and the perpendicular polarization;
adjusting the second intensity of the second component beam and the third intensity of the third component beam based on the overlay recipe;
measuring an intensity of at least one of the first and second component beams; and
determining an overlay error based on the measuring.

16. The method of claim 15, wherein the adjusting the second intensity of the second component beam and the third intensity of the third component beam comprises adjusting the second intensity and the third intensity to a same intensity.

17. The method of claim 16, wherein splitting and polarizing the first reflected beam into the second component beam further comprises focusing the second component beam on the image sensor and reflecting the third component beam off of a mirror and focusing the third component beam on the image sensor.

18. The method of claim 16, wherein splitting and polarizing the first reflected beam into the second component beam further comprises focusing the second component beam on the image sensor and focusing the third component beam on another image sensor.

19. The method of claim 16, further comprising:
adjusting the first intensity of the first component beam to at most 10% of an intensity of the diffraction pattern beam; and
adjusting the intensities of the second and third component beams to be the same intensity, the same intensity being at least 45% of the intensity of the diffraction pattern beam.

20. The method of claim 15, wherein adjusting the first intensity, the second intensity, and the third intensity comprises adjusting a wavelength of at least one of the first component, the second component, and the third component.

* * * * *